(12) United States Patent
Nakajima

(10) Patent No.: US 9,255,940 B2
(45) Date of Patent: Feb. 9, 2016

(54) SENSOR AND METHOD FOR MANUFACTURING SENSOR

(71) Applicant: Seiko Epson Corporation, Tokyo (JP)

(72) Inventor: Satoshi Nakajima, Okaya (JP)

(73) Assignee: Seiko Epson Corporation (JP)

( * ) Notice: Subject to any disclaimer, the term of this patent is extended or adjusted under 35 U.S.C. 154(b) by 192 days.

(21) Appl. No.: 14/159,538

(22) Filed: Jan. 21, 2014

(65) Prior Publication Data

US 2014/0204552 A1 Jul. 24, 2014

(30) Foreign Application Priority Data

Jan. 22, 2013 (JP) .................................. 2013-009017

(51) Int. Cl.
| | |
|---|---|
| *H05K 1/11* | (2006.01) |
| *H05K 1/14* | (2006.01) |
| *G01P 1/02* | (2006.01) |
| *G01L 19/00* | (2006.01) |
| *G01P 15/125* | (2006.01) |
| *B81C 1/00* | (2006.01) |

(Continued)

(52) U.S. Cl.
CPC ............... *G01P 1/023* (2013.01); *B81C 1/0023* (2013.01); *G01L 19/00* (2013.01); *G01P 15/125* (2013.01); *H01L 23/3121* (2013.01); *H01L 24/73* (2013.01); *H01L 24/92* (2013.01); *B81B 2201/0235* (2013.01); *B81B 2203/0136* (2013.01); *B81B 2207/012* (2013.01); *H01L 24/16* (2013.01); *H01L 24/48* (2013.01); *H01L 24/81* (2013.01); *H01L 24/83* (2013.01); *H01L 24/85* (2013.01); *H01L 25/16* (2013.01); *H01L 2224/16195* (2013.01); *H01L 2224/2919* (2013.01); *H01L 2224/32225* (2013.01); *H01L 2224/45144* (2013.01); *H01L 2224/48227* (2013.01); *H01L 2224/73207* (2013.01); *H01L 2224/83855* (2013.01); *H01L 2224/92127* (2013.01); *H01L 2924/15787* (2013.01); *H01L 2924/15788* (2013.01); *Y10T 156/10* (2013.01)

(58) Field of Classification Search
CPC ................ H01L 2924/00014; H01L 2924/00; H01L 2224/2919; H01L 2224/45144; H01L 2224/83855; H01L 2924/15787; H01L 2924/15788; H01L 2224/16195; H01L 2224/32225; H01L 2224/48227; H01L 2224/73207
USPC .................. 361/760, 728, 764, 807, 809, 820; 174/255, 260, 259; 257/686, 777, 723
See application file for complete search history.

(56) References Cited

U.S. PATENT DOCUMENTS

| | | | |
|---|---|---|---|
| 2005/0097958 A1* | 5/2005 | Ikegami ................ | G01P 15/123 73/514.16 |
| 2008/0023805 A1* | 1/2008 | Howard .............. | H01L 23/3121 257/666 |

(Continued)

FOREIGN PATENT DOCUMENTS

| | | |
|---|---|---|
| JP | 09-252081 | 9/1997 |
| JP | 2008-107183 A | 5/2008 |

(Continued)

*Primary Examiner* — Yuriy Semenenko
(74) *Attorney, Agent, or Firm* — Harness, Dickey & Pierce, P.L.C.

(57) ABSTRACT

A sensor includes: a substrate on which an active chip including a semiconductor circuit is disposed; and a passive chip including an acceleration sensor, and a thick portion and a thin portion, the thick portion being disposed on the substrate so as to be in contact therewith. An active chip terminal is disposed on the active chip. A passive chip terminal is disposed on the passive chip at the thin portion. The passive chip terminal and the active chip terminal face each other and are connected via a bump.

6 Claims, 7 Drawing Sheets

(51) Int. Cl.
*H01L 23/31* (2006.01)
*H01L 23/00* (2006.01)
*H01L 25/16* (2006.01)

(56) References Cited

U.S. PATENT DOCUMENTS

2013/0037861 A1* 2/2013 Jang ............... H01L 27/1461
257/222

2014/0151822 A1* 6/2014 Graham ............... G01L 9/0047
257/415
2015/0114129 A1* 4/2015 Chen ............... G01L 19/0618
73/721

FOREIGN PATENT DOCUMENTS

JP 2010-040656 A 2/2010
JP 2011-245587 A 12/2011

* cited by examiner

SENSOR AND METHOD FOR MANUFACTURING SENSOR

BACKGROUND

1. Technical Field

The present invention relates to a sensor and a method for manufacturing a sensor.

2. Related Art

Sensors on which a passive element such as a sensor element is mounted are widely manufactured and utilized. JP-A-2008-107183 (Patent Document 1) discloses a sensor on which a chip with a sensor element mounted thereon and a processing circuit are mounted. According to Patent Document 1, the sensor includes a resin case in which the sensor chip and a processing circuit chip are disposed. A pressure-sensitive element is disposed on the sensor chip.

Terminals are disposed on the sensor chip and the processing circuit chip. The terminal of the sensor chip and the terminal of the processing circuit chip are connected by a gold wire.

The processing circuit chip supplies the sensor chip with a weak current. The pressure-sensitive element serving as a sensor is driven by the weak current. When a distance between the processing circuit chip and the sensor chip between which the current flows is long, the sensor is likely to be affected by electromagnetic noise. The sensor chip and the processing circuit chip disclosed in Patent Document 1 are connected using the wire.

The terminals of the sensor chip and the processing circuit chip face in the same direction, and a distance between the terminals is suitable for the work of wire bonding. The length of a wire between terminals is restricted by the layout of terminals or the dimensions of a sensor. Then, in wire bonding, noise is likely to be added to an electrical signal communicated between terminals, resulting in a reduction in the S/N ratio of the electrical signal. The processing circuit chip is referred to as an active chip, and the sensor chip is referred to as a passive chip. A sensor is desired in which the sensor has a structure capable of preventing a reduction in the S/N ratio of an electrical signal communicated between the active chip and the passive chip due to noise being added to the electrical signal.

SUMMARY

An advantage of some aspects of the invention is to solve the problem described above, and the invention can be realized as the following modes or application examples.

APPLICATION EXAMPLE 1

This application example is directed to a sensor including: a substrate on which an active chip including an active element is placed; and a plate-shaped passive chip including a passive element, wherein an active chip terminal connected with the active element is disposed on the active chip, the passive chip includes a portion having a first thickness in a thickness direction and a portion having a second thickness thicker than the first thickness, the portion having the second thickness being placed on the substrate, a passive chip terminal connected with the passive element is disposed on the passive chip at the portion having the first thickness, and the passive chip terminal and the active chip terminal face each other and are connected via a bump.

According to this application example, the active chip and the passive chip are placed on the substrate. The active chip includes the active element and the active chip terminal. The active chip is arranged such that the active chip terminal faces the passive chip.

The passive chip includes the passive element and the passive chip terminal. The passive chip includes the portion having the first thickness in the thickness direction and the portion having the second thickness thicker than the first thickness. The portion having the second thickness is placed on the substrate. The passive chip terminal is disposed at the portion having the first thickness. The passive chip terminal faces the active chip terminal. The passive chip terminal and the active chip terminal are arranged to face each other. The passive chip terminal and the active chip terminal are connected via the bump.

The active chip supplies the passive chip with a weak current, and the passive element is driven by the weak current. When a distance between the active chip and the passive chip between which the current flows is long, the sensor is likely to be affected by electromagnetic noise. The passive chip terminal and the active chip terminal of the application example are arranged to face each other and connected via the bump. Accordingly, it is possible to configure a structure in which the distance between the active chip and the passive chip is short compared with the case of using wire bonding. Accordingly, it is possible to prevent a reduction in the S/N ratio of an electrical signal communicated between the active chip and the passive chip due to noise being added to the electrical signal.

APPLICATION EXAMPLE 2

This application example is directed to the sensor according to the application example described above, wherein each of the active chip and the passive chip is placed on the substrate via a thermosetting adhesive.

According to this application example, the active chip is placed on the substrate via the thermosetting adhesive. The passive chip is also disposed on the substrate via the thermosetting adhesive. Since the thermosetting adhesive is unlikely to be deformed after curing, the relative position between the substrate and the active chip is unlikely to change. Similarly, the relative position between the substrate and the passive chip is unlikely to change. Accordingly, since the relative position between the active chip and the passive chip is unlikely to change, the connection between the active chip terminal and the passive chip terminal via the bump can be maintained at high quality.

APPLICATION EXAMPLE 3

This application example is directed to the sensor according to the application example described above, wherein an output terminal is disposed on the active chip, an input terminal is disposed on the substrate, and the output terminal and the input terminal are connected via a wire.

According to this application example, the output terminal is disposed on the active chip, and the input terminal is disposed on the substrate. The output terminal and the input terminal are connected via the wire. The active chip allows an amount of current that is unlikely to be affected by noise to flow. Since the wire can allow a large current to flow therethrough, the current that is unlikely to be affected by noise can flow between the active chip and the substrate.

APPLICATION EXAMPLE 4

This application example is directed to the sensor according to the application example described above, wherein an output terminal is disposed on a surface of the active chip opposite to a surface thereof on which the active chip terminal is disposed, the output terminal being connected with the active element via a through-electrode, an input terminal is disposed on the substrate, and the output terminal and the input terminal are connected.

According to this application example, the output terminal is disposed on the active chip, and the active element and the output terminal are connected by the through-electrode. The input terminal is disposed on the substrate, and the output terminal and the input terminal are connected. The active chip allows an amount of current that is unlikely to be affected by noise to flow. Since the through-electrode can allow a large current to flow therethrough, the current that is unlikely to be affected by noise can flow between the active chip and the output terminal.

APPLICATION EXAMPLE 5

This application example is directed to the sensor according to the application example described above, wherein the material of the bump is metal containing gold.

According to this application example, the material of the bump is metal containing gold. Gold is metal having a low electrical resistance, and the metal containing gold can make a connection between the terminals with a low contact resistance. Accordingly, the resistance between the active chip terminal and the passive chip terminal can be reduced.

APPLICATION EXAMPLE 6

This application example is directed to a method for manufacturing a sensor including: bonding an active chip including an active element and an active chip terminal to a substrate using a thermosetting adhesive; and bonding a passive chip including a passive element and a passive chip terminal to the substrate using a thermosetting adhesive, wherein the passive chip has a plate shape and includes a portion having a first thickness in a thickness direction and a portion having a second thickness thicker than the first thickness, the portion having the first thickness being disposed with the passive chip terminal, in the bonding of the active chip, the active chip terminal is arranged to face the side opposite to the substrate, and in the bonding of the passive chip, the passive chip terminal and the active chip terminal are arranged with a bump interposed therebetween while the portion having the second thickness is bonded to the substrate.

According to this application example, the active chip includes the active element and the active chip terminal. In the bonding of the active chip, the active chip terminal is arranged to face the side opposite to the substrate. Then, the active chip is bonded to the substrate with the thermosetting adhesive.

The passive chip includes the passive element and the passive chip terminal. The passive chip has a plate shape and includes the portion having the first thickness in the thickness direction and the portion having the second thickness thicker than the first thickness. The passive chip terminal is disposed at the portion having the first thickness. In the bonding of the passive chip, the passive chip terminal and the active chip terminal are arranged with the bump interposed therebetween. Then, the portion having the second thickness of the passive chip is bonded to the substrate with the thermosetting adhesive.

The active chip supplies the passive chip with a weak current, and the passive element is driven by the weak current. When a distance between the active chip and the passive chip between which the current flows is long, the sensor is likely to be affected by electromagnetic noise. The passive chip terminal and the active chip terminal of the application example are arranged to face each other and connected via the bump. Accordingly, it is possible to configure a structure in which the distance between the active chip and the passive chip is short compared with the case of using wire bonding. Accordingly, it is possible to prevent a reduction in the S/N ratio of an electrical signal communicated between the active chip and the passive chip due to noise being added to the electrical signal.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
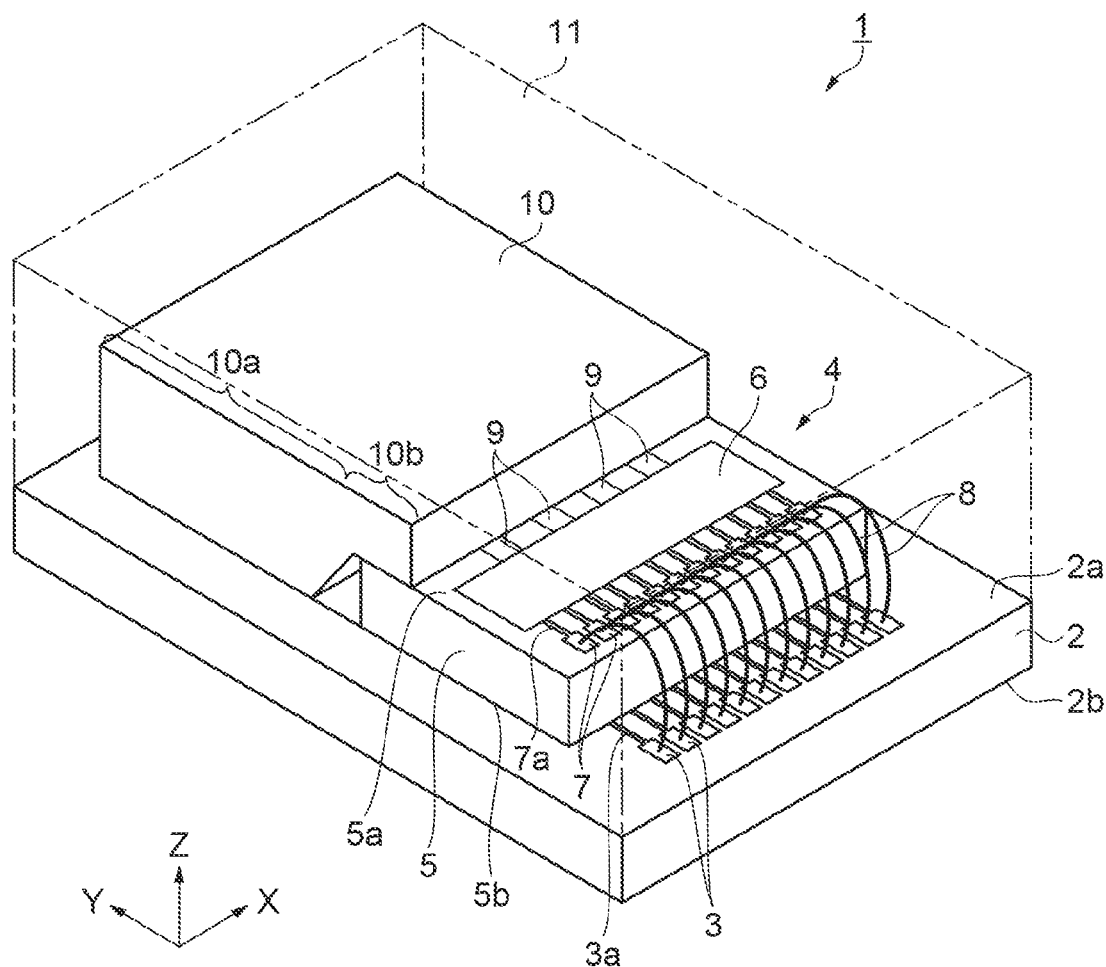
FIG. 1A is a schematic perspective view showing the structure of a sensor according to a first embodiment.

In embodiments, characteristic examples of a sensor and a method for manufacturing the sensor will be described according to FIGS. 1A to 7. Hereinafter, the embodiments will be described according to the drawings. Members in the drawings are shown on different scales to make each of the members have a recognizable size in the drawings.

First Embodiment

Figure 1B:
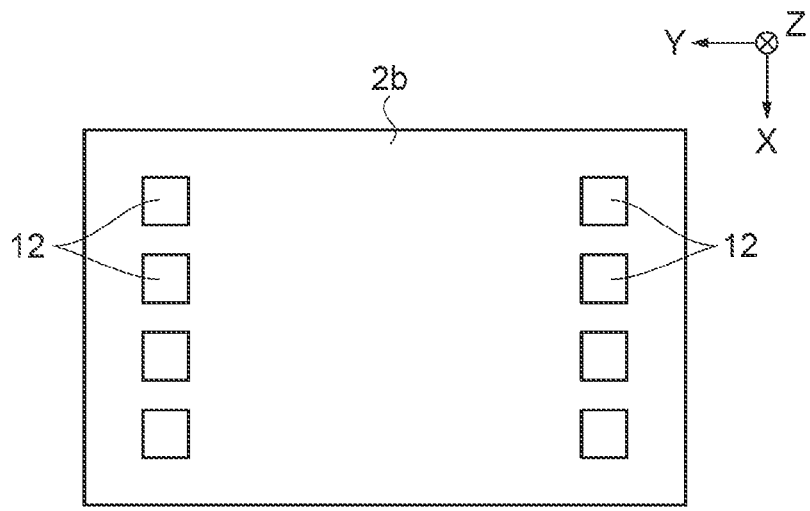
FIG. 1B is a schematic bottom plan view showing the structure of the sensor.

A sensor and a method for manufacturing the sensor according to a first embodiment will be described according to FIGS. 1A to 6D. FIG. 1A is a schematic perspective view showing the structure of the sensor. FIG. 1B is a schematic bottom plan view showing the structure of the sensor. As shown in FIG. 1A, the sensor 1 includes a rectangular substrate 2. A longitudinal direction of the substrate 2 is defined as a Y-direction. A direction orthogonal to the Y-direction in a planar direction of the substrate 2 is defined as an X-direction. A thickness direction of the substrate 2 is defined as a Z-direction.

A surface of the substrate 2 on a positive Z-direction side is a top surface 2a, and a surface of the substrate 2 on a negative Z-direction side is a back surface 2b. Twelve input terminals 3 are arranged in parallel in the X-direction on a negative Y-direction side of the top surface 2a. A wiring 3a is connected to each of the input terminals 3.

The material of the substrate 2 is not particularly limited as long as the material has strength and heat resistance. As the material of the substrate 2, an epoxy resin substrate containing glass, a glass substrate, a silicon substrate, a ceramic substrate or the like can be used. In the embodiment, for example, an epoxy resin substrate containing glass is used as the substrate 2.

An active chip 4 is placed on the top surface 2a of the substrate 2. The active chip 4 includes an active chip substrate 5. A surface of the active chip substrate 5 facing the positive Z-direction side is atop surface 5a, and a surface of the active chip substrate 5 facing the negative Z-direction side is a back surface 5b. The active chip substrate 5 is a silicon substrate. A semiconductor circuit 6 as an active element and output terminals 7 for performing input/output of the semiconductor circuit 6 are disposed on the top surface 5a of the active chip substrate 5.

Twelve output terminals 7 are disposed. Each of the output terminals 7 is connected by a wiring 7a with the semiconductor circuit 6. A step corresponding to the thickness of the active chip substrate 5 is present in the Z-direction between the output terminal 7 and the input terminal 3. The output terminal 7 and the input terminal 3 are connected by a wire 8. The wire 8 is made of metal containing gold, and preferably as close to pure gold as possible. The form of wiring by the wire 8 is referred to as wire bonding. The output terminal 7 and the input terminal 3 are connected by wire bonding. Four active chip terminals 9 extending from the semiconductor circuit 6 in the Y-direction are disposed on the top surface 5a of the active chip substrate 5. The numbers of the output terminals 7, the input terminals 3, and the active chip terminals 9 are not particularly limited. The numbers of the respective terminals are set according to the specifications of the sensor 1.

An electrical signal flowing between the semiconductor circuit 6 and an output terminal 12 through the output terminal 7, the wire 8, and the input terminal 3 has, for example, a voltage of from 1.8V to 3.6V and a current of about 8 mA. Accordingly, the current flowing between the semiconductor circuit 6 and the output terminal 12 is unlikely to be affected by electromagnetic noise. The wire 8 contains gold and has a low electrical resistance. Therefore, even when a current of about 8 mA flows through the wire, the voltage drop is small.

A passive chip 10 is placed on the top surface 2a of the substrate 2 on a positive Y-direction side of the active chip substrate 5. The passive chip 10 includes a thick portion 10a as a portion having a second thickness and a thin portion 10b as a portion having a first thickness. The thick portion 10a is thicker than the thin portion 10b. The thick portion 10a is the positive Y-direction side of the passive chip 10. The thick portion 10a of the passive chip 10 is placed on the substrate 2 so as to be in contact therewith. The thin portion 10b overlaps a portion of the substrate 2.

A passive element is disposed inside the passive chip 10. A driver circuit that drives the passive element and a processing circuit that performs predetermined arithmetic processing using an output of the passive element are disposed in the semiconductor circuit 6. The active chip terminal 9 serves as a portion of a pathway of a current that performs communication between the passive element and the semiconductor circuit 6.

A mold 11 is disposed on the top surface 2a of the substrate 2 to cover the active chip 4 and the passive chip 10. The mold 11 is made mainly of a resin and prevents dust or moisture from adhering to the active chip 4 and the passive chip 10.

As shown in FIG. 1B, eight output terminals 12 are disposed on the back surface 2b of the substrate 2. The output terminals 12 are connected to the input terminals 3. The output terminal 12 is a terminal for communicating an electrical signal with the semiconductor circuit 6. The number of the output terminals 12 is not particularly limited. The number of the output terminals 12 is set according to the specifications of the sensor 1.

Figure 2A:
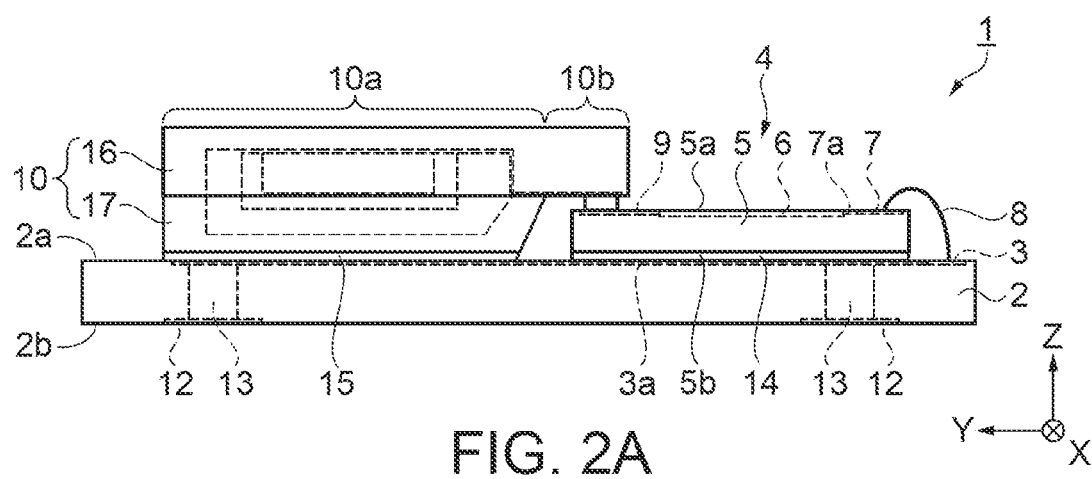
FIG. 2A is a schematic side view showing the structure of the sensor.
Figure 2B:
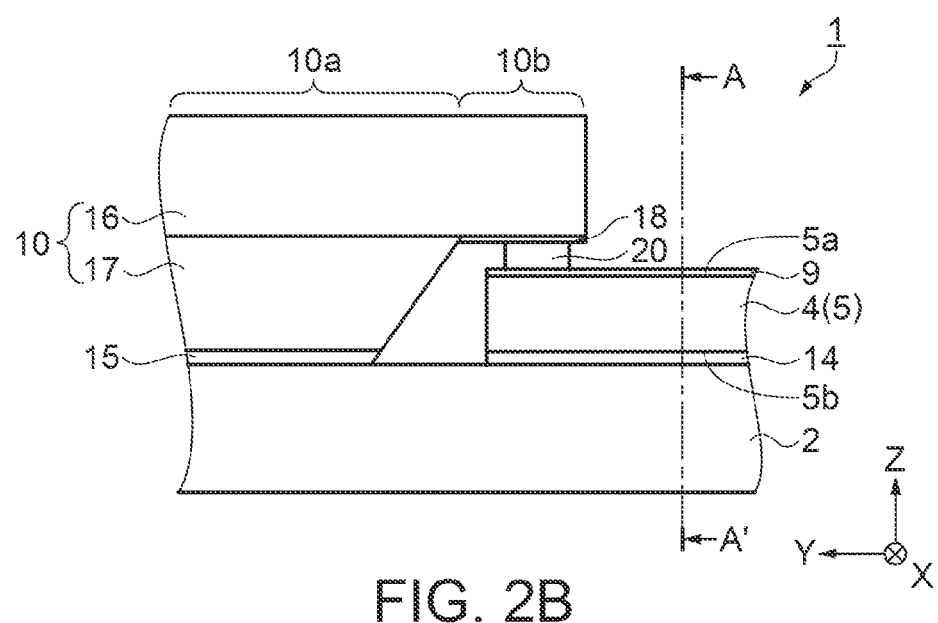
FIG. 2B is a main part schematic enlarged view showing a connection portion between an active chip and a passive chip.
Figure 2C:
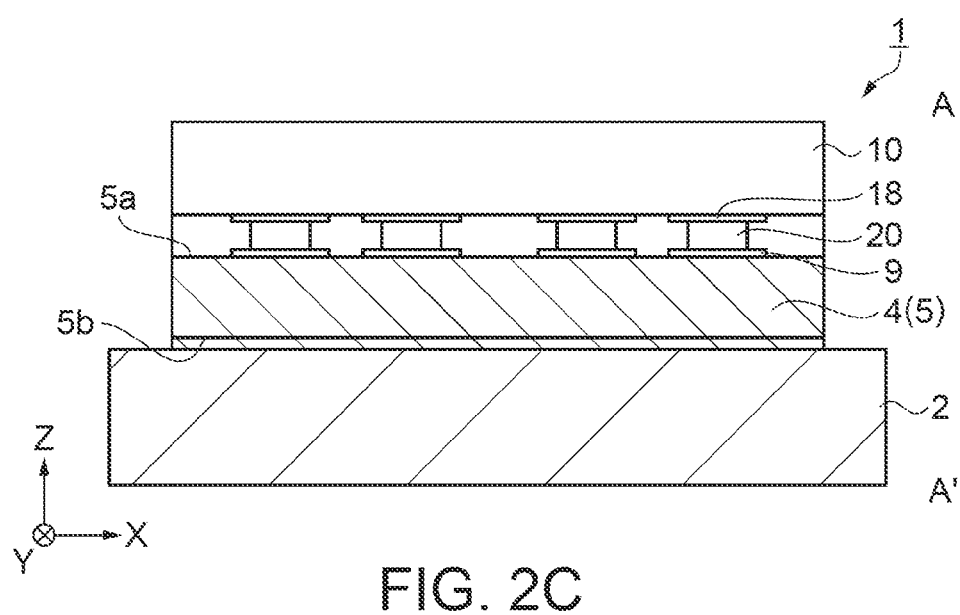
FIG. 2C is a schematic side view showing the structure of the sensor.

FIG. 2A is a schematic side view showing the structure of the sensor. FIG. 2B is a main part schematic enlarged view showing a connection portion between the active chip and the passive chip. FIG. 2C is a schematic side view showing the structure of the sensor, taken along line A-A' of FIG. 2B. As shown in FIGS. 2A to 2C, the wiring 3a connected with the input terminal 3 is disposed to extend from the input terminal 3 in the Y-direction on the top surface 2a of the substrate 2. Through-electrodes 13 are disposed between the wirings 3a and the output terminals 12.

A thermosetting adhesive 14 is disposed between the substrate 2 and the active chip 4. The active chip 4 is bonded to the top surface 2a of the substrate 2 with the thermosetting adhesive 14. Similarly, a thermosetting adhesive 15 is disposed between the substrate 2 and the passive chip 10. The passive chip 10 is bonded to the top surface 2a of the substrate 2 with the thermosetting adhesive 15. The thermosetting adhesive 14 and the thermosetting adhesive 15 are also referred to as a die attach adhesive.

The passive chip 10 includes a passive substrate portion 16 and a lid portion 17. The passive substrate portion 16 is a quadrilateral plate-shaped member. The lid portion 17 is a plate-shaped member whose length in the Y-direction is shorter than that of the passive substrate portion 16. The lid portion 17 is located close to the substrate 2. The passive substrate portion 16 is located away from the substrate 2. The lid portion 17 is bonded to the substrate 2 with the thermosetting adhesive 15.

An overlapping portion of the passive substrate portion 16 and the lid portion 17 is the thick portion 10a. A non-overlapping portion of the passive substrate portion 16 and the lid portion 17 on the negative Y-direction side is the thin portion 10b. The thin portion 10b of the passive substrate portion 16 is arranged so as to face the active chip 4. Passive chip terminals 18 are disposed on the passive substrate portion 16 at places facing the active chip 4.

Four passive chip terminals 18 are disposed like the active chip terminals 9. A bump 20 is arranged between the active chip terminal 9 and the passive chip terminal 18. The active chip terminal 9 and the passive chip terminal 18 are electrically connected by the bump 20. The numbers of the passive chip terminals 18 and the active chip terminals 9 are not particularly limited. The numbers of the passive chip terminals 18 and the active chip terminals 9 are set according to the specifications of the sensor 1.

Figure 3A:
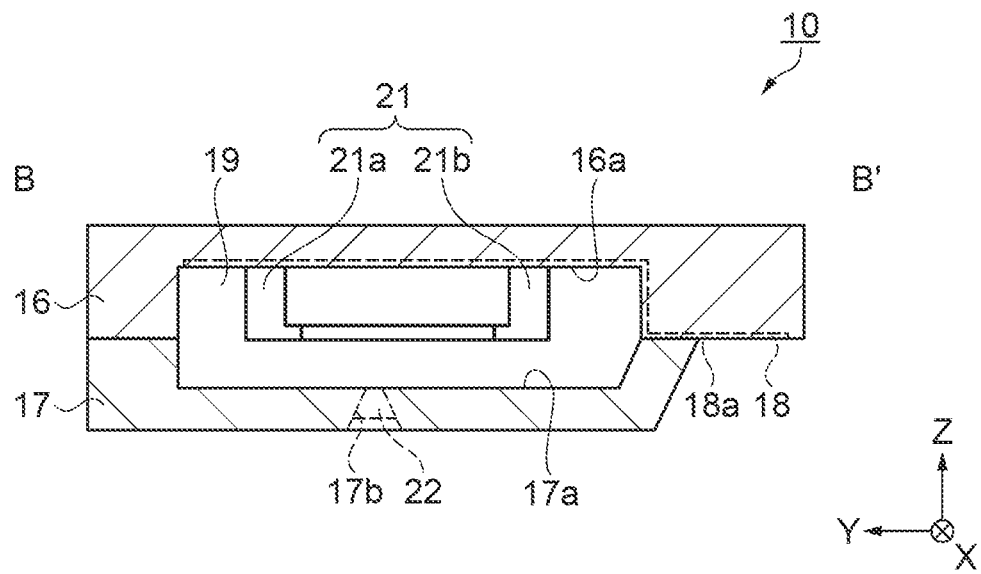
FIG. 3A is a schematic sectional side elevation showing the structure of the passive chip.
Figure 3B:
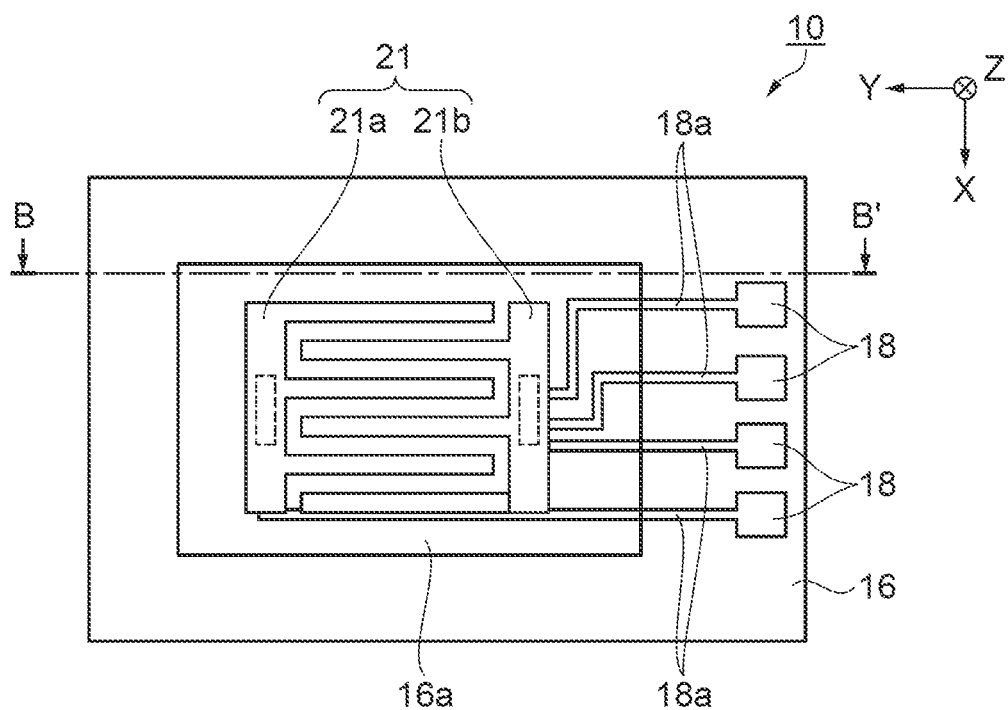
FIG. 3B is a schematic plan view showing the structure of the passive chip.

FIG. 3A is a schematic sectional side elevation showing the structure of the passive chip; and FIG. 3B is a schematic plan view showing the structure of the passive chip.

FIG. 3A is a sectional side elevation viewed along line B-B' of FIG. 3B. FIG. 3B shows the passive chip 10 with the lid portion 17 removed.

As shown in FIGS. 3A and 3B, a recess 16a that is rectangular in plan view is formed in the passive substrate portion 16. An acceleration sensor element 21 as a passive element is disposed in the recess 16a. The acceleration sensor element 21 includes a first comb-tooth body 21a and a second comb-tooth body 21b. The first comb-tooth body 21a and the second comb-tooth body 21b are disposed so as to face each other with a predetermined gap therebetween. Each of the first comb-tooth body 21a and the second comb-tooth body 21b is provided with three comb teeth. Roots of the comb teeth are fixed at the recess 16a. The shape and number of comb teeth are not particularly limited. As the number of comb teeth is increased, the sensitivity of the acceleration sensor element 21 is more improved. In the embodiment, the number of comb teeth is three for facilitating the understanding of the drawing.

The passive chip terminals 18 are each connected by a wiring 18a to the acceleration sensor element 21. When an acceleration in the X-direction is applied to the acceleration sensor element 21, a distance in the X-direction between the first comb-tooth body 21a and the second comb-tooth body 21b changes. An electrode is disposed on a surface of the first comb-tooth body 21a and a surface of the second comb-tooth body 21b.

A voltage is applied between the electrode of the first comb-tooth body 21a and the electrode of the second comb-tooth body 21b, which acts as a capacitor that is a passive element. When the distance in the X-direction between the first comb-tooth body 21a and the second comb-tooth body 21b changes, a capacitance between the electrode of the first comb-tooth body 21a and the electrode of the second comb-tooth body 21b changes. The semiconductor circuit 6 detects the capacitance between the electrode of the first comb-tooth body 21a and the electrode of the second comb-tooth body 21b and performs a predetermined arithmetic operation, thereby calculating an acceleration applied to the acceleration sensor element 21. An electrical signal communicated between the acceleration sensor element 21 and the semiconductor circuit 6 through the wiring 18a, the passive chip terminal 18, and the active chip terminal 9 has a voltage of, for example, 1.8V and a current of several hundred microamperes or less. The current flowing between the passive chip terminal 18 and the active chip terminal 9 is weak and therefore likely to be affected by external electromagnetic noise.

A recess 17a is formed in the lid portion 17 at a place facing the recess 16a. The passive substrate portion 16 and the lid portion 17 are bonded together such that the recess 16a and the recess 17a face each other. The recess 16a and the recess 17a form a cavity 19, which is filled with nitrogen gas at a predetermined pressure. When the pressure of the nitrogen gas is high, it is difficult for the first comb-tooth body 21a and the second comb-tooth body 21b to vibrate. Sensitivity characteristics of the first comb-tooth body 21a and the second comb-tooth body 21b are adjusted by the pressure of the nitrogen gas.

A sealing hole 17b is disposed on the negative Z-direction side of the lid portion 17. The cavity 19 is filled with nitrogen gas through the sealing hole 17b, and thereafter, the sealing hole 17b is sealed with a sealing member 22.

The materials of the passive substrate portion 16, the acceleration sensor element 21, and the lid portion 17 are not particularly limited as long as the material has strength, is highly insulating, and can be processed. Silicon, glass, ceramic, or the like can be used. In the embodiment, for example, a silicon substrate is used as the materials of the passive substrate portion 16 and the acceleration sensor element 21. Glass is used as the material of the lid portion 17.

The material of the sealing member 22 is not particularly limited as long as the material has a good affinity with the lid portion 17 and can seal the cavity 19. In the embodiment, for example, a gold-germanium alloy is used as the material of the sealing member 22. The material of the bump 20 is preferably low in electrical resistance and easily deformable, and gold or a gold alloy can be used. In the embodiment, for example, gold is used as the material of the bump 20. It is sufficient that the materials of the active chip terminal 9, the output terminal 7, the input terminal 3, and the output terminal 12 have conductivity and are easily formable, and various kinds of metal can be used. For example, indium, aluminum, copper, silver, nickel, or an alloy of these can be used. In the embodiment, for example, a titanium-tungsten alloy layer is stacked on an ITO (Indium Tin Oxide) film at the passive chip terminal 18, and a gold layer is further stacked on the titanium-tungsten alloy layer.

Figure 4:
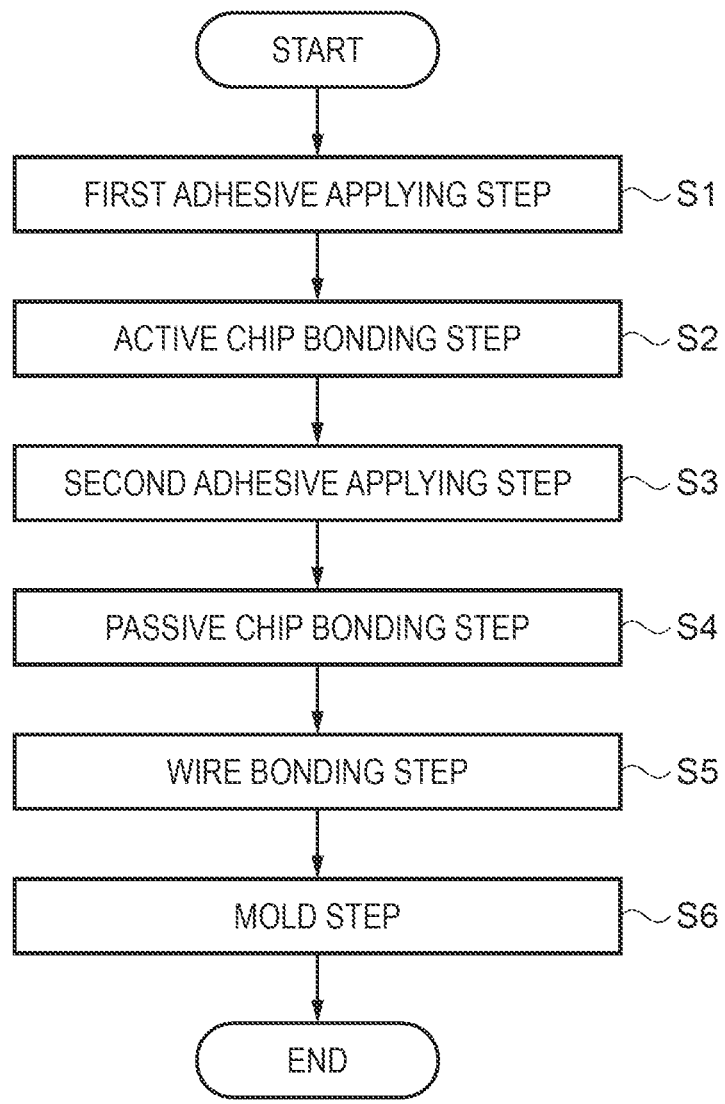
FIG. 4 is a flowchart showing a method for manufacturing the sensor.

Next, a method for manufacturing the sensor 1 described above will be described with reference to FIGS. 4 to 6D. FIG. 4 is a flowchart showing the method for manufacturing the sensor. FIGS. 5A to 6D are schematic views for explaining the method for manufacturing the sensor. In the flowchart of FIG. 4, Step S1 corresponds to a first adhesive applying step, in which the thermosetting adhesive 14 is applied to a place of the substrate 2 where the active chip 4 is placed. Next, the method proceeds to Step S2. Step S2 corresponds to an active chip bonding step. In this step, the active chip 4 is mounted on the substrate 2, and the thermosetting adhesive 14 is cured. Next, the method proceeds to Step S3.

Step S3 corresponds to a second adhesive applying step. In this step, the thermosetting adhesive 15 is applied to a place of the substrate 2 where the passive chip 10 is placed. Next, the method proceeds to Step S4. Step S4 corresponds to a passive chip bonding step. In this step, the passive chip 10 is mounted on the substrate 2, and the thermosetting adhesive 15 is cured. Next, the method proceeds to Step S5. Step S5 corresponds to a wire bonding step. In this step, the output terminal 7 and the input terminal 3 are connected by the wire 8. Next, the method proceeds to Step S6. Step S6 corresponds to a mold step. In this step, the mold 11 is disposed on the substrate 2 and solidified. Through the steps described above, the sensor 1 is completed.

Figure 5A:
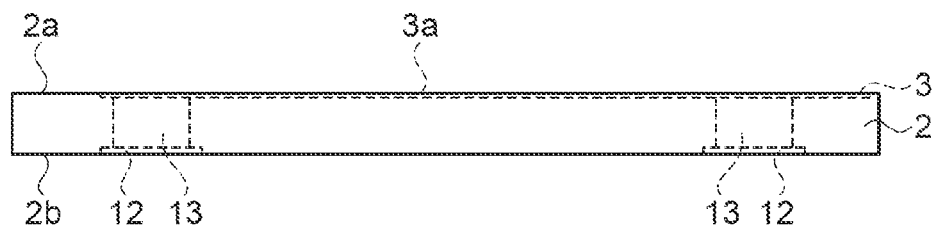
FIGS. 5A to 5E are schematic views for explaining the method for manufacturing the sensor.
Figure 5B:
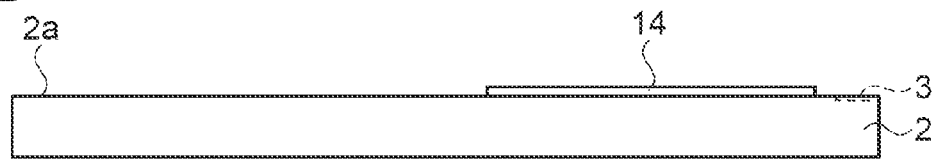

Next, with reference to FIGS. 5A to 6D, the manufacturing method will be described in detail in association with the steps shown in FIG. 4. FIGS. 5A and 5B correspond to the first adhesive applying step in Step S1. As shown in FIG. 5A, the substrate 2 is prepared in Step S1. The input terminal 3 and the wiring 3a are disposed on the top surface 2a of the substrate 2. The output terminal 12 is disposed on the back surface 2b of the substrate 2. The through-electrode 13 is disposed between the wiring 3a and the output terminal 12. The forming methods of the input terminal 3, the wiring 3a, the through-electrode 13, and the output terminal 12 are publicly known, and therefore, the description thereof is omitted.

Next, as shown in FIG. 5B, the thermosetting adhesive 14 is applied on the substrate 2. For the thermosetting adhesive 14, various kinds of adhesives, called "die attach adhesive", can be used. There are many kinds of the thermosetting adhesive 14, and therefore, it is preferable to select the thermosetting adhesive 14 to suit the material of an object to be bonded therewith.

A method for applying the thermosetting adhesive 14 on the substrate 2 is not particularly limited. Various kinds of methods, such as a method for applying the thermosetting adhesive 14 on the substrate 2 using a dispenser, screen printing, letterpress printing, and offset printing, can be used.

Figure 5C:
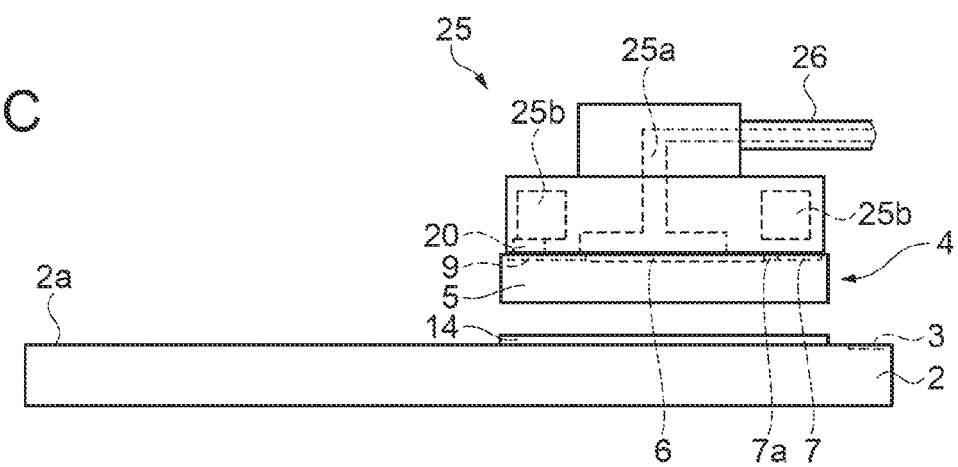
Figure 5D:
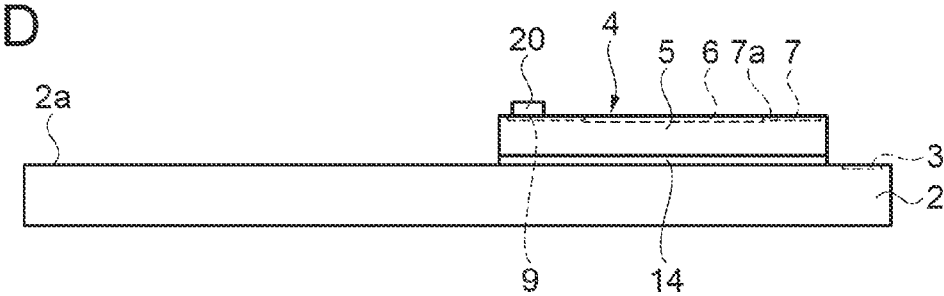

FIGS. 5C and 5D correspond to the active chip bonding step in Step S2. As shown in FIG. 5C, the active chip 4 is prepared in Step S2. The semiconductor circuit 6, the wiring 7a, the output terminal 7, and the active chip terminal 9 are disposed on the active chip 4. The bump 20 is disposed on the active chip terminal 9.

The thickness of the bump 20 is preferably from 30 µm to 40 µm. When the thickness of the bump 20 is smaller than 30 µm, it is impossible to deal with fluctuations in the thicknesses of the thermosetting adhesive 14 and the thermosetting adhesive 15. When the thickness of the bump 20 is greater than 40 µm, the bump 20 spreads out when interposed between the active chip 4 and the passive chip 10, causing a risk of short circuit between the active chip terminals 9.

The forming method of the bump 20 is not particularly limited. The bump 20 can be formed by an electrolytic plating method, an electroless plating method, a method using a wire bonder, or the like. In the embodiment, for example, the bump 20 is formed using an electroless gold plating method.

The active chip 4 is held by suction by a suction hand 25. A pipe 25a is disposed inside the suction hand 25. The pipe 25a is connected by a tube 26 with a vacuum pump (not shown). The vacuum pump is operated to reduce the pressure of the air inside the pipe 25a, so that the suction hand 25 suctions the active chip substrate 5.

The suction hand 25 is moved by a handler (not shown). An operator operates the handler to move the suction hand 25 to a predetermined place. In a state where the suction hand 25 holds the active chip substrate 5, the operator moves the active chip substrate 5 to a place facing the thermosetting adhesive 14. Various kinds of robots can be utilized as the handler.

Next, the handler lowers the suction hand 25. The suction hand 25 brings the active chip substrate 5 into contact with the thermosetting adhesive 14. The suction hand 25 includes a heater 25b therein. The suction hand 25 causes the heater 25b to heat. The heat of the heater 25b is conducted to the active chip substrate 5, so that the active chip substrate 5 heats the thermosetting adhesive 14. The thermosetting adhesive 14 is cured by heating to bond the substrate 2 and the active chip substrate 5 together. The heating temperature and the heating time are not particularly limited. In the embodiment, for example, the heating temperature is 400° C., and the heating time is about 0.5 sec.

After the thermosetting adhesive 14 is solidified, the suction hand 25 sets the pressure of the air inside the pipe 25a to an atmospheric pressure. The handler raises the suction hand 25 to separate the suction hand 25 from the active chip substrate 5. As a result, as shown in FIG. 5D, the active chip 4 is bonded to the top surface 2a of the substrate 2. The active chip terminal 9 of the active chip 4 and the bump 20 are disposed to face the side opposite to the substrate 2.

Figure 5E:
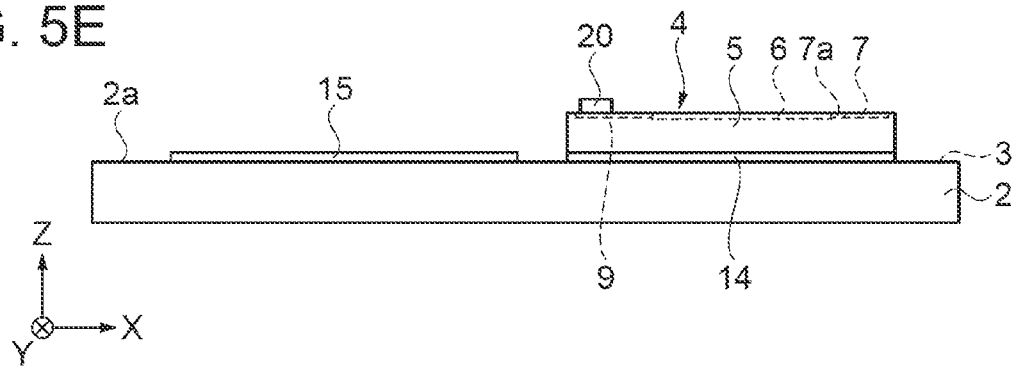

FIG. 5E corresponds to the second adhesive applying step in Step S3. As shown in FIG. 5E, the thermosetting adhesive 15 is applied on the substrate 2 in Step S3. The thermosetting adhesive 15 is the same adhesive as the thermosetting adhesive 14, and various kinds of adhesives, called "die attach adhesive", can be used. A method for applying the thermosetting adhesive 15 on the substrate 2 is not particularly limited. The same method as that of Step S1 can be used.

Figure 6A:
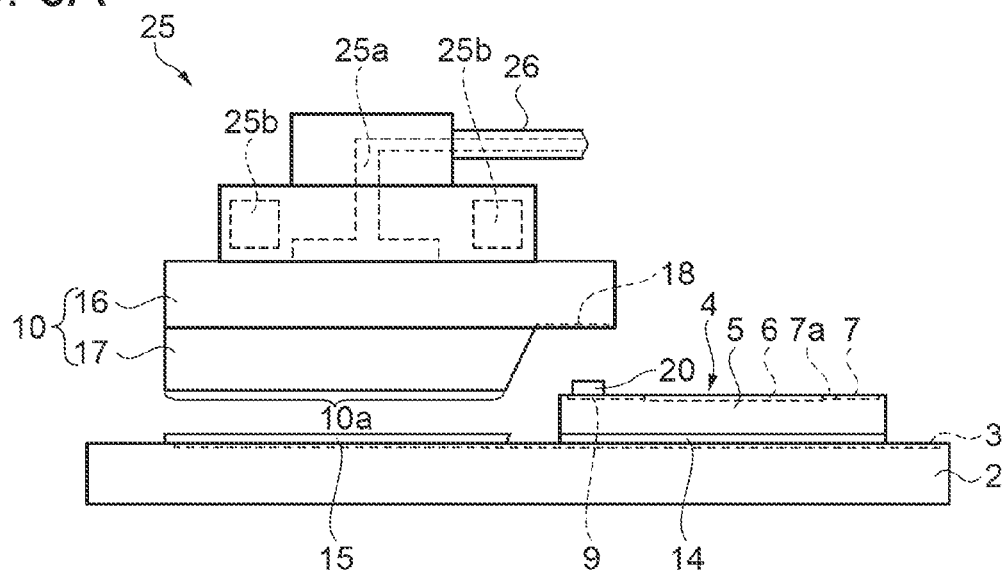
FIGS. 6A to 6D are schematic views for explaining the method for manufacturing the sensor.
Figure 6B:
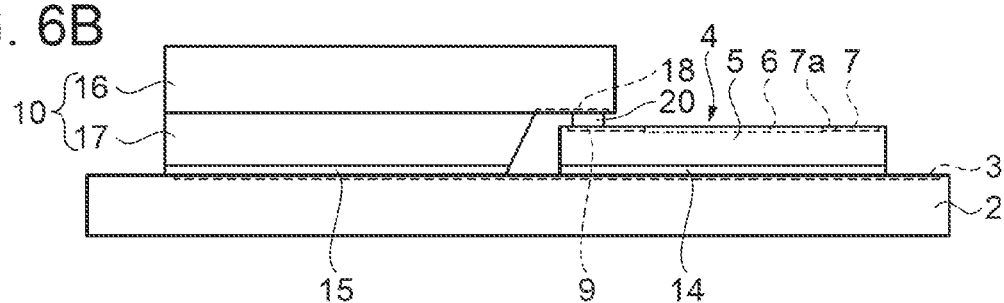

FIGS. 6A and 6B correspond to the passive chip bonding step in Step S4. As shown in FIG. 6A, the passive chip 10 is held by suction by the suction hand 25 in Step S4. The suction hand 25 is moved by the handler (not shown). In a state where the suction hand 25 holds the passive chip 10, the handler moves the thick portion 10a of the passive chip 10 to a place facing the thermosetting adhesive 15. Further, the handler moves the suction hand 25 to move the passive chip terminal 18 to a place facing the bump 20 on the active chip terminal 9.

Next, the handler lowers the suction hand 25. The suction hand 25 brings the thick portion 10a of the passive chip 10 into contact with the thermosetting adhesive 15. Then, the suction hand 25 brings the passive chip terminal 18 into contact with the bump 20. Due to this, the bump 20 is rendered into a form in which the bump 20 is interposed between the active chip terminal 9 and the passive chip terminal 18.

The suction hand 25 causes the heater 25b to heat. The heat of the heater 25b is conducted to the passive chip 10, and the passive chip 10 heats the thermosetting adhesive 15. The thermosetting adhesive 15 is cured by heating to bond the substrate 2 and the passive chip 10 together. The heating temperature and the heating time are not particularly limited. In the embodiment, for example, the heating temperature is 400° C., and the heating time is about 0.5 sec.

After the thermosetting adhesive 15 is solidified, the suction hand 25 sets the pressure of the air inside the pipe 25a to an atmospheric pressure. The handler raises the suction hand 25 to separate the suction hand 25 from the passive chip 10. As a result, as shown in FIG. 6B, the passive chip 10 is disposed on the top surface 2a of the substrate 2. The active chip terminal 9 of the active chip 4 and the passive chip terminal 18 of the passive chip 10 are connected via the bump 20.

Figure 6C:
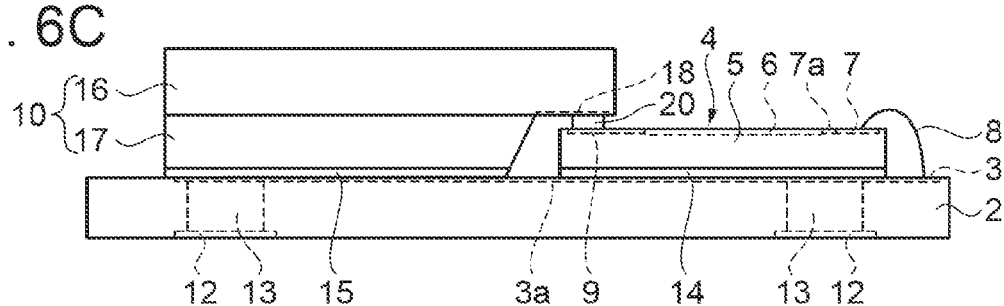

FIG. 6C corresponds to the wire bonding step in Step S5. As shown in FIG. 6C, the substrate 2 is put on a bonding apparatus (not shown) in Step S5. The bonding apparatus is an apparatus that connects the terminals by the wire 8. The bonding apparatus slides the end of the wire 8 by ultrasound at the terminal to thereby fuse the end of the wire 8 to the terminal. First, one end of the wire 8 is connected to the output terminal 7 on the active chip 4. Next, the other end of the wire 8 is guided to the input terminal 3 to be connected with the input terminal 3 on the substrate 2. As a result, the output terminal 7 and the input terminal 3 are connected by the wire 8. Since the input terminal 3 is electrically connected with the output terminal 12, an output of the semiconductor circuit 6 is output to the output terminal 12.

Figure 6D:
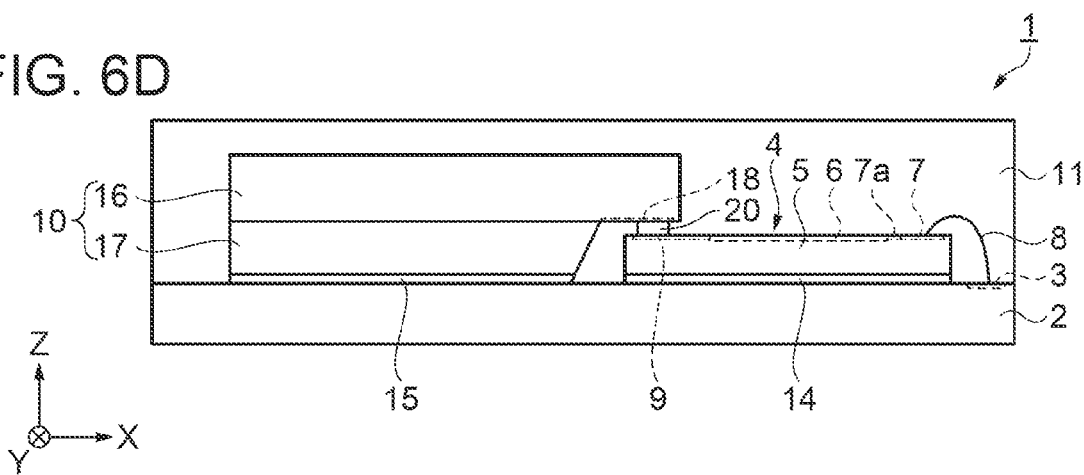

FIG. 6D corresponds to the mold step in Step S6. As shown in FIG. 6D, the top surface 2a side of the substrate 2 is covered with the mold 11 in Step S6. The substrate 2 is put on a mold (not shown). Next, a resin material is charged into the mold to thereby form the mold 11. Through the steps described above, the sensor 1 is completed.

As described above, according to the embodiment, the following advantageous effects are provided.

(1) According to the embodiment, the active chip 4 supplies the passive chip 10 with a weak current, and the acceleration sensor element 21 is driven by the weak current. When a distance between the active chip 4 and the passive chip 10 between which the current flows is long, the sensor is likely to be affected by electromagnetic noise. In the embodiment, the passive chip terminal 18 and the active chip terminal 9 are arranged to face each other and connected via the bump 20. Accordingly, it is possible to configure a structure in which the distance between the active chip 4 and the passive chip is short compared to the case of using wire bonding. Accordingly, it is possible to prevent a reduction in the S/N ratio of an electrical signal communicated between the active chip 4 and the passive chip 10 due to noise being added to the electrical signal.

(2) According to the embodiment, the active chip 4 is disposed on the substrate 2 via the thermosetting adhesive 14. The passive chip 10 is also disposed on the substrate 2 via the thermosetting adhesive 15. Since the thermosetting adhesive 14 is unlikely to be deformed after curing, the relative position between the substrate 2 and the active chip 4 is unlikely to change. Similarly, since the thermosetting adhesive 15 is unlikely to be deformed after curing, the relative position between the substrate 2 and the passive chip 10 is unlikely to change. Accordingly, since the relative position between the active chip 4 and the passive chip 10 is unlikely to change, the connection between the active chip terminal 9 and the passive chip terminal 18 via the bump 20 can be maintained at high quality.

(3) According to the embodiment, the output terminal 7 and the input terminal 3 are connected via the wire 8. The active chip 4 allows an amount of current that is unlikely to be affected by noise to flow. Since the wire 8 can allow a large current to flow therethrough, a large current can flow between the active chip 4 and the substrate 2.

(4) According to the embodiment, the material of the bump 20 is metal containing gold. Gold is metal having a low electrical resistance, and the metal containing gold can make a connection between the active chip terminal 9 and the passive chip terminal 18 with a low contact resistance. Accordingly, the electrical resistance between the active chip terminal 9 and the passive chip terminal 18 can be reduced.

Second Embodiment

Next, another embodiment of a sensor will be described with reference to FIG. 7, which is a main part schematic side view of the sensor. A second embodiment differs from the first embodiment in that a through-electrode is disposed in an active chip substrate of an active chip. The description of the same points as those of the first embodiment is omitted.

Figure 7:
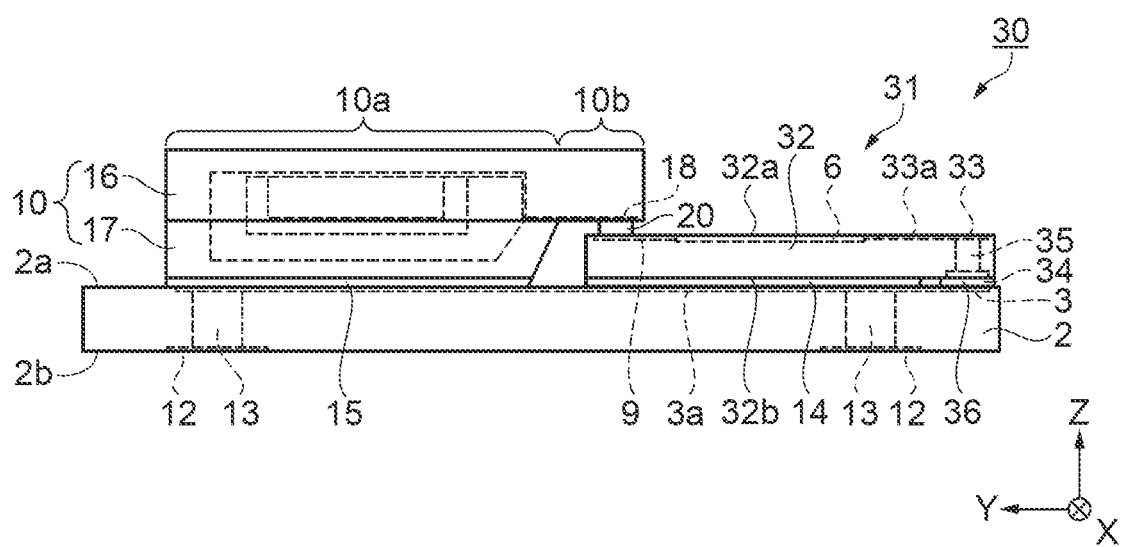
FIG. 7 is a main part schematic side view of a sensor according to a second embodiment.

In the embodiment, as shown in FIG. 7, a sensor 30 includes the substrate 2. An active chip 31 is disposed on the top surface 2*a* of the substrate 2 via the thermosetting adhesive 14. The active chip 31 includes an active chip substrate 32. A surface of the active chip substrate 32 facing the positive Z-direction side is a top surface 32*a*, and a surface of the active chip substrate 32 facing the negative Z-direction side is a back surface 32*b*. The active chip substrate 32 is a silicon substrate. The semiconductor circuit 6 and intermediate terminals 33 through which input/output signals of the semiconductor circuit 6 are transmitted are disposed on the top surface 32*a* of the active chip substrate 32. Twelve intermediate terminals 33 are disposed. Each of the intermediate terminals 33 is connected by a wiring 33*a* with the semiconductor circuit 6.

Output terminals 34 are disposed on the back surface 32*b* of the active chip substrate 32. A through-electrode 35 penetrating the active chip substrate 32 is disposed between the output terminal 34 and the intermediate terminal 33. An electrical signal output by the active chip 31 is transmitted through the wiring 33*a*, the intermediate terminal 33, the through-electrode 35, and the output terminal 34 in this order.

A bump 36 is disposed between the output terminal 34 and the input terminal 3. The output terminal 34 and the input terminal 3 are electrically connected by the bump 36. The form of the bump 36 is not particularly limited, and the same form as that of the bump 20 can be adopted. In the substrate 2, the input terminal 3 and the output terminal 12 are electrically connected via the wiring 3*a* and the through-electrode 13. Accordingly, the semiconductor circuit 6 and the output terminal 12 are electrically connected.

As described above, according to the embodiment, the following advantageous effect is provided.

(1) According to the embodiment, the output terminal 34 is disposed on the active chip 31, and the intermediate terminal 33 and the output terminal 34 are connected by the through-electrode 35. The input terminal 3 is disposed on the substrate 2. The output terminal 34 and the input terminal 3 are connected via the bump 36. The active chip 31 allows an amount of current that is unlikely to be affected by noise to flow. Since the through-electrode 35 can allow a large current to flow therethrough, the active chip 31 can allow a large current to flow between the top surface 32*a* and the back surface 32*b* of the active chip substrate 32 and the substrate 2. As a result, it is possible in the sensor 30 that an electrical signal output by the semiconductor circuit 6 to the output terminal 12 is unlikely to be affected by noise.

The invention is not limited to the embodiments described above. Various modifications or improvements can be added within the technical idea of the invention by a person having ordinal knowledge in the field. Modified examples will be described below.

MODIFIED EXAMPLE 1

In the first embodiment, the substrate 2 and the passive chip 10 are bonded together using the thermosetting adhesive 15. Further, the substrate 2 and the active chip 4 are bonded together using the thermosetting adhesive 14. Instead of a thermosetting adhesive, a die attach sheet may be used. The die attach sheet is one of thermosetting adhesives. With the use of the die attach sheet, the active chip 4 or the passive chip 10 can be fixed on the substrate 2 with good workability.

MODIFIED EXAMPLE 2

In the first embodiment, the acceleration sensor element 21 is disposed in the passive chip 10. Other kinds of sensors may be disposed in the passive chip 10. For example, various kinds of elements such as a gyro sensor, a temperature sensor, a magnetic sensor, and a humidity sensor can be applied to the passive element. The contents of Modified Example 1 and Modified Example 2 may be applied to the second embodiment.

The entire disclosure of Japanese Patent Application No. 2013-009017 filed on Jan. 22, 2013 is expressly incorporated by reference herein.

What is claimed is:

1. A sensor comprising:
   a substrate on which an active chip including an active element is placed; and
   a plate-shaped passive chip including a passive element, wherein
   an active chip terminal connected with the active element is disposed on the active chip,
   the passive chip includes a portion having a first thickness in a thickness direction and a portion having a second thickness thicker than the first thickness, the portion having the second thickness being placed on the substrate,
   a passive chip terminal connected with the passive element is disposed on the passive chip at the portion having the first thickness, and
   the passive chip terminal and the active chip terminal face each other and are connected via a bump.

2. The sensor according to claim 1, wherein
   each of the active chip and the passive chip is placed on the substrate via a thermosetting adhesive.

3. The sensor according to claim 1, wherein
   an output terminal is disposed on the active chip,
   an input terminal is disposed on the substrate, and
   the output terminal and the input terminal are connected via a wire.

4. The sensor according to claim 1, wherein
   an output terminal is disposed on a surface of the active chip opposite to a surface thereof on which the active chip terminal is disposed, the output terminal being connected with the active element via a through-electrode,
   an input terminal is disposed on the substrate, and
   the output terminal and the input terminal are connected.

5. The sensor according to claim 1, wherein
   the material of the bump is metal containing gold.

6. A method for manufacturing a sensor, comprising:
   bonding an active chip including an active element and an active chip terminal to a substrate using a thermosetting adhesive; and
   bonding a passive chip including a passive element and a passive chip terminal to the substrate using a thermosetting adhesive, wherein the passive chip has a plate shape and includes a portion having a first thickness in a thickness direction and a portion having a second thickness thicker than the first thickness, the portion having the first thickness being disposed with the passive chip terminal, in the bonding of the active chip, the active chip terminal is arranged to face the side opposite to the substrate, and in the bonding of the passive chip, the passive chip terminal and the active chip terminal are arranged with a bump interposed therebetween while the portion having the second thickness is bonded to the substrate.

* * * * *